United States Patent
Ni

(10) Patent No.: US 12,513,987 B2
(45) Date of Patent: Dec. 30, 2025

(54) DISPLAY SUBSTRATE AND MANUFACTURING METHOD, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Liusong Ni, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 682 days.

(21) Appl. No.: 17/787,692

(22) PCT Filed: Sep. 14, 2021

(86) PCT No.: PCT/CN2021/118242
§ 371 (c)(1),
(2) Date: Jun. 21, 2022

(87) PCT Pub. No.: WO2022/089066
PCT Pub. Date: May 5, 2022

(65) Prior Publication Data
US 2023/0017854 A1    Jan. 19, 2023

(30) Foreign Application Priority Data

Oct. 26, 2020 (CN) .......................... 202011154879.7

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0221* (2025.01); *H10D 86/421* (2025.01)

(58) Field of Classification Search
CPC .. H10D 86/60; H10D 86/0221; H10D 86/421; H10D 86/6723; H10D 86/0231;
(Continued)

(56) References Cited

U.S. PATENT DOCUMENTS

2008/0143939 A1* 6/2008 Adachi ............. G02F 1/134363
                                                              349/114
2011/0241000 A1* 10/2011 Choi ..................... H10K 50/852
                                                               257/59
(Continued)

FOREIGN PATENT DOCUMENTS

CN          102881655 A      1/2013
CN          105070687 A      11/2015
(Continued)

OTHER PUBLICATIONS

CN 202011154879.7 first office action.
PCT/CN2021/118242 international search report and written opinion.

*Primary Examiner* — Joseph C. Nicely
*Assistant Examiner* — Adam D Weiland
(74) *Attorney, Agent, or Firm* — IPro, PLLC

(57) ABSTRACT

The present disclosure provides a display substrate, a manufacturing method, and a display device. The method includes: providing a base substrate; forming a driving circuitry layer on the base substrate; forming an inorganic insulation layer on the driving circuitry layer; forming a pattern of a planarization layer on the inorganic insulation layer, the planarization layer being made of an organic material; forming a first transparent conductive layer on the planarization layer; and forming a through hole through a
(Continued)

patterning process, a photoresist used during the exposure of the patterning process including an organic material.

5 Claims, 5 Drawing Sheets

(58) Field of Classification Search
CPC ............. H10D 86/451; H10D 86/441; H10D 86/021–0251; H10D 30/67–6759; H10D 30/031–0327; H10K 59/12; H10K 59/1201; H10K 59/123; H10K 50/81; H10K 50/82; H10K 50/816; H10K 50/828; H10K 10/46–491; H10H 29/142
See application file for complete search history.

(56) References Cited

U.S. PATENT DOCUMENTS

| | | | |
|---|---|---|---|
| 2013/0017636 A1 | 1/2013 | Kim et al. | |
| 2014/0042444 A1* | 2/2014 | Huang | H10D 30/6746 438/34 |
| 2015/0060863 A1* | 3/2015 | Li | H10D 86/60 438/151 |
| 2019/0027622 A1* | 1/2019 | Shida | H10K 71/40 |
| 2020/0043955 A1* | 2/2020 | Suzuki | H10D 30/6723 |
| 2021/0036075 A1 | 2/2021 | Wang et al. | |
| 2021/0104651 A1* | 4/2021 | Bae | H10H 29/142 |
| 2021/0134905 A1 | 5/2021 | Zhang et al. | |
| 2021/0200090 A1 | 7/2021 | Li et al. | |

FOREIGN PATENT DOCUMENTS

| | | |
|---|---|---|
| CN | 109270796 A | 1/2019 |
| CN | 110400810 A | 11/2019 |
| CN | 110660839 A | 1/2020 |
| CN | 110752220 A | 2/2020 |
| CN | 112271189 A | 1/2021 |

* cited by examiner

DISPLAY SUBSTRATE AND MANUFACTURING METHOD, AND DISPLAY DEVICE

CROSS REFERENCE TO RELATED APPLICATIONS

This application is the U.S. national phase of PCT Application No. PCT/CN2021/118242 filed on Sep. 14, 2021, which claims a priority of the Chinese Patent Application No. 202011154879.7 filed on Oct. 26, 2020, which is incorporated herein by reference in its entirety.

TECHNICAL FIELD

The present disclosure relates to the field of display technology, in particular to a display substrate, a manufacturing method thereof, and a display device.

BACKGROUND

During the manufacture of a display substrate, usually a film layer structure needs to be formed through a plurality of patterning processes. Usually, a photoresist made of an organic material needs to be used in the patterning process. However, some structures in the display substrate are also made of an organic material, and there is a binding effect between the organic materials, so after the patterning process, it is difficult to remove the photoresist, and thereby the performance of the display device is adversely affected.

SUMMARY

An object of the present disclosure is to provide a display substrate, a manufacturing method thereof, and a display device, so as to solve the problem in the related art where the performance of the display device is adversely affected when it is difficult to remove the photoresist in the patterning process.

In one aspect, the present disclosure provides in a possible embodiment of the present disclosure a method for manufacturing a display substrate, including: providing a base substrate; forming a driving circuitry layer on the base substrate; forming an inorganic insulation layer on the driving circuitry layer; forming a pattern of a planarization layer on the inorganic insulation layer, a material of the planarization layer including an organic material, and the pattern of the planarization layer covering a partial region of the inorganic insulation layer; forming a first transparent conductive layer on the planarization layer; and forming a through hole through a patterning process in a region where the inorganic insulation layer is not covered by the pattern of the planarization layer, the through hole penetrating through the inorganic insulation layer and the first transparent conductive layer in a direction perpendicular to the base substrate, and a photoresist used during the exposure of the patterning process including an organic material.

In a possible embodiment of the present disclosure, the forming the through hole through a patterning process includes: patterning the first transparent conductive layer to form a first conductive pattern including a first through sub-hole; and patterning the inorganic insulation layer to form a protection layer pattern including a second through sub-hole. Orthogonal projections of the first through sub-hole and the second through sub-hole onto the base substrate overlap each other, and the first through sub-hole and the second through sub-hole form the through hole.

In a possible embodiment of the present disclosure, the patterning the first transparent conductive layer to form the first conductive pattern including a first through sub-hole includes: forming a photoresist on the first transparent conductive layer, and exposing and developing the photoresist to form a first photoresist unreserved region corresponding to a region where the first through sub-hole is to be formed and a first photoresist reserved region; and wet etching the first transparent conductive layer at the first photoresist unreserved region so as to expose a part of the inorganic insulation layer corresponding to the first photoresist unreserved region, the first transparent conductive layer located in the first photoresist reserved region forming the first conductive pattern. The patterning the inorganic insulation layer to form the protection layer pattern including the second through sub-hole includes: dry etching the inorganic insulation layer at the first photoresist unreserved region to form a pattern of a protection layer through the inorganic insulation layer in the first photoresist reserved region; and removing the photoresist at the first photoresist reserved region.

In a possible embodiment of the present disclosure, an angle between a side wall of the first through sub-hole and a direction parallel to the base substrate is less than an angle between a side wall of the second through sub-hole and the direction parallel to the base substrate.

In a possible embodiment of the present disclosure, subsequent to forming the through hole through a patterning process, the method further includes: forming a second transparent conductive layer on the first conductive pattern, the second transparent conductive layer being electrically coupled to the driving circuitry layer through the through hole; and patterning the first conductive pattern and the second transparent conductive layer to form a first electrode including a first electrode sub-layer and a second electrode sub-layer, the first conductive pattern forming the first electrode sub-layer and the second transparent conductive layer forming the second electrode sub-layer.

In a possible embodiment of the present disclosure, the patterning the first conductive pattern and the second transparent conductive layer includes: forming a photoresist on the second transparent conductive layer, and exposing and developing the photoresist to form a second photoresist unreserved region and a second photoresist reserved region to the through hole and the first electrode to be formed; etching the first conductive pattern and the second transparent conductive layer in the second photoresist unreserved region, so as to form the first electrode sub-layer through the first conductive pattern in the second photoresist reserved region, and form the second electrode sub-layer through the second transparent conductive layer in the second photoresist reserved region; and removing the photoresist in the second photoresist reserved region.

In a possible embodiment of the present disclosure, an orthogonal projection of the first electrode sub-layer onto the base substrate is located within an orthogonal projection of the second electrode sub-layer onto the base substrate.

In a possible embodiment of the present disclosure, a thickness of the first electrode sub-layer is less than a thickness of the second electrode sub-layer in a direction perpendicular to the base substrate, a sum of the thicknesses of the first electrode sub-layer and the second electrode sub-layer is 50 nm to 200 nm, and film-forming conditions of the first electrode sub-layer and the second electrode sub-layer are the same.

In another aspect, the present disclosure provides in some embodiments a display substrate manufactured by the above-mentioned method.

In yet another aspect, the present disclosure provides in some embodiments a display device including the above-mentioned display substrate.

According to the embodiments of the present disclosure, the method includes: providing the base substrate; for the driving circuitry layer on the base substrate; forming the inorganic insulation layer on the driving circuitry layer; forming the pattern of the planarization layer on the inorganic insulation layer, the material of the planarization layer including an organic material, and the pattern of the planarization layer covering a partial region of the inorganic insulation layer; forming the first transparent conductive layer on the planarization layer; and forming the through hole through a patterning process in a region where the inorganic insulation layer is not covered by the pattern of the planarization layer, the through hole penetrating through the inorganic insulation layer and the first transparent conductive layer in the direction perpendicular to the base substrate, and the photoresist used during the exposure of the patterning process including an organic material. Through the first transparent conductive layer, it is able to prevent the organic material of the planarization layer from being in direct contact with the photoresist used for forming the through hole in the inorganic insulation layer, reduce the difficulty in the removal of the photoresist subsequently, and reduce the amount of residual photoresist, thereby to improve the structure reliability.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments a method for manufacturing a display substrate.

Figure 1:
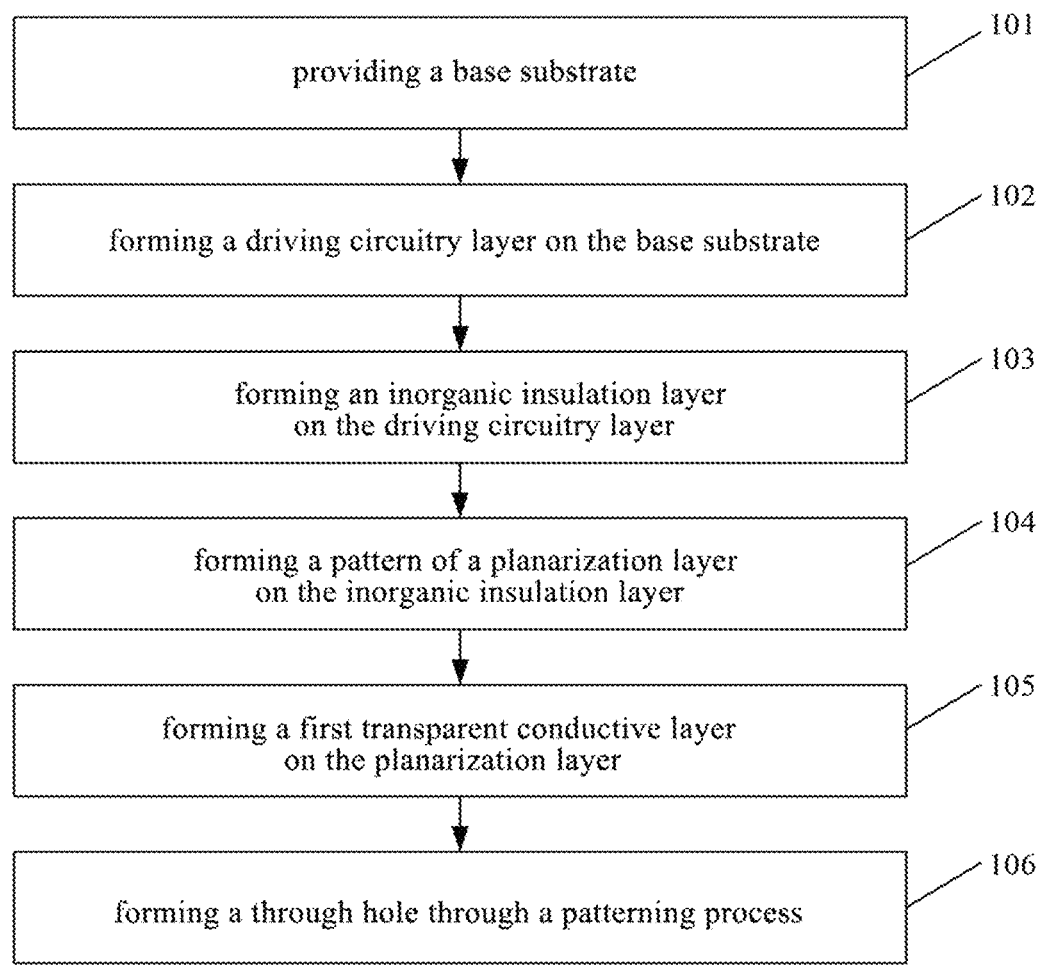
FIG. 1 is a flow chart of a method for manufacturing a display substrate according to one embodiment of the present disclosure.

As shown in FIG. 1, in the embodiments of the present disclosure, the method includes the following steps.

Step 101: providing a base substrate.

Figure 2A:
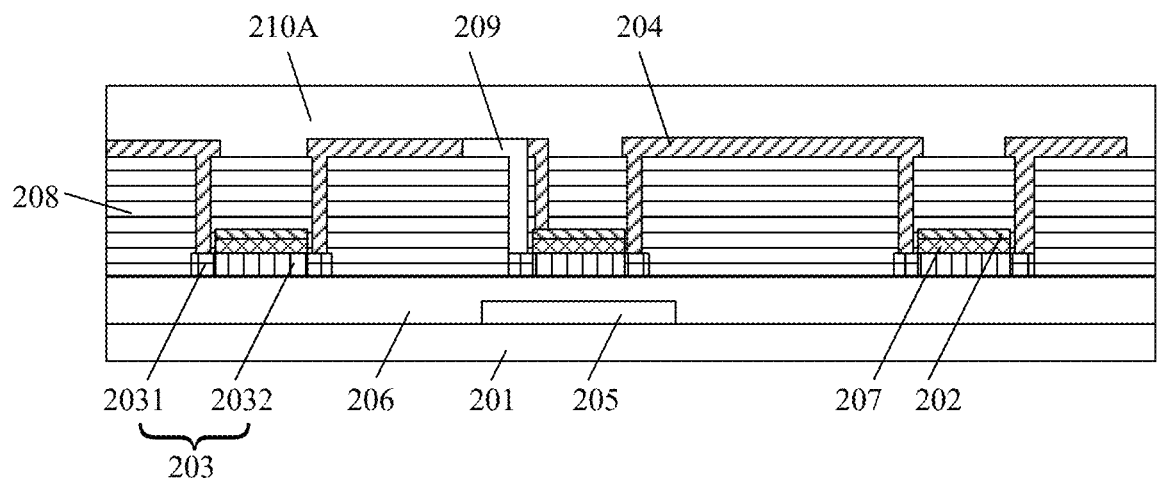
FIG. 2A is a schematic view showing the manufacture of the display substrate according to one embodiment of the present disclosure.

As shown in FIG. 2A, the base substrate 201 in the embodiments of the present disclosure may be a flexible substrate, and it may be made of, but not limited to, polyimide. In addition, the base substrate 201 may also be a rigid substrate, e.g., a glass substrate.

Step 102: forming a driving circuitry layer on the base substrate.

The driving circuitry layer in the embodiments of the present disclosure includes a thin film transistor, e.g., an amorphous silicon thin film transistor, a polycrystalline silicon thin film transistor, or an oxide thin film transistor.

With reference to FIG. 2A again, usually the thin film transistor includes a gate electrode 202, an active layer 203 and a source/drain electrode layer 204. In addition, the driving circuitry layer further includes some other structural or functional film layers according to the practical need, for example, a protection layer 205, a buffer layer 206, a gate insulation layer 207, a dielectric layer 208, and a power source signal line 209.

In a possible embodiment of the present disclosure, a metal layer is deposited on the base substrate. For example, a metal such as molybdenum or aluminum is deposited on the base substrate through a sputtering device to form the metal layer. Obviously, the material of the metal layer is not limited thereto.

Next, the metal layer is patterned through a patterning process to form a pattern of the protection layer 205. The pattern of the protection layer 205 corresponds to the active layer 203 of the thin film transistor, so as to protect the active layer 205 of the thin film transistor.

Next, an insulation thin film is deposited on the protection layer 205 as the buffer layer 206. Specifically, for example, a silicon oxide or nitride is deposited through Plasma Enhanced Chemical Vapor Deposition (PECVD) as the buffer layer 206.

Next, a semiconductor material is deposited and patterned so as to form the active layer 203. Taking an oxide thin film transistor as an example, a metal oxide such as indium gallium zinc oxide (IGZO) or indium tin zinc oxide (ITZO) is deposited and patterned to form the active layer 203.

Next, the gate insulation layer 207 and the gate electrode 202 are sequentially formed.

In some embodiments of the present disclosure, a part of the active layer 203 may be subject to special treatment to form a conductor. In this way, the active layer includes a conductive portion 2031 and a semiconductor portion 2032, and the semiconductor portion 2032 forms a channel region of the thin film transistor.

Next, a silicon oxide or nitride is deposited and patterned to form the dielectric layer 208. A metal layer made of copper or aluminum is deposited and patterned to form the power source signal line 209 and the source/drain electrode layer 204. The source/drain electrode layer 204 specifically includes a source electrode and a drain electrode coupled to the active layer 203 through the conductive portion 2031 of the active layer 203.

In a possible embodiment of the present disclosure, the power source signal line 209 is formed through a separate patterning process. In some other embodiments of the present disclosure, the power source signal line 209 and the source/drain electrode layer 204 are arranged at a same layer and made of a same material. In other words, the power source signal line 209 and the source/drain electrode layer 204 are formed through a single patterning process, So as to reduce the quantity of process steps as well as the manufacture cost.

It should be appreciated that, the power source signal line 209 is used for providing a power source signal, and it is not in direct electrical contact with the source electrode and the drain electrode of the thin film transistor. In other words, there is a spacing between the power source signal line 209 and each of the source electrode and the drain electrode of the thin film transistor when viewed in a top view corresponding to FIG. 2A. In the embodiments of the present disclosure, they are shown in a same sectional view for ease of description.

In this way, the manufacture of the driving circuitry layer has been completed. Obviously, the structure of the driving circuitry layer is not limited thereto, and it may be adjusted according to the practical need, which will not be particularly defined herein.

Step 103: forming an inorganic insulation layer on the driving circuitry layer.

With reference to FIG. 2A again, in the embodiments of the present disclosure, a silicon oxide or nitride is deposited through PECVD, so as to form the inorganic insulation layer 210A may be formed, thereby to form the protection layer PVX 210B of the display substrate subsequently.

Figure 2B:
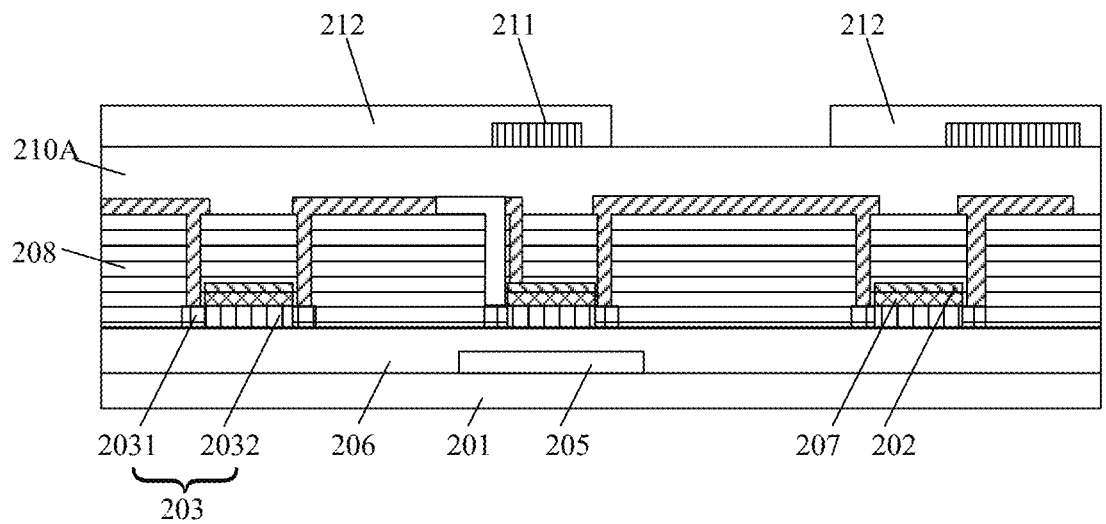
FIG. 2B is another schematic view showing the manufacture of the display substrate according to one embodiment of the present disclosure.

As shown in FIGS. 2A and 2B, after the formation of the inorganic insulation layer 210A, a color filter (CF) 211 is formed according to the practical need.

Step 104: forming a pattern of a planarization layer on the inorganic insulation layer. A material of the planarization layer includes an organic material, and the pattern of the planarization layer covers a partial region of the inorganic insulation layer.

Figure 2C:
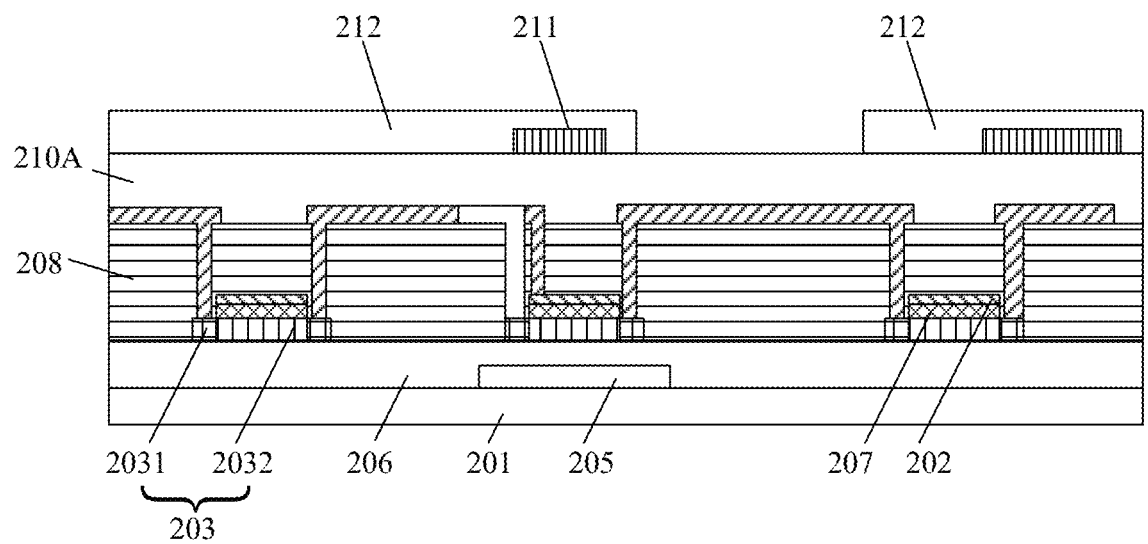
FIG. 2C is yet another schematic view showing the manufacture of the display substrate according to one embodiment of the present disclosure.

As shown in FIG. 2C, the pattern of the planarization layer 212 is further formed on the inorganic insulation layer 210A. Specifically, an organic material layer, e.g., a resin layer, is deposited and then planarized and patterned to form the pattern of the planarization layer 212. After patterning the organic material layer, a portion of the inorganic insulation layer is exposed.

The organic material layer in the embodiments of the present disclosure may be made of a photosensitive material, for example, a photosensitive resin. In this way, it is unnecessary to apply any additional photoresist during the patterning of the organic material layer, thereby there is no residual photoresist when patterning the organic material layer to form the planarization layer 212.

Step 105: forming a first transparent conductive layer on the planarization layer.

Figure 2D:
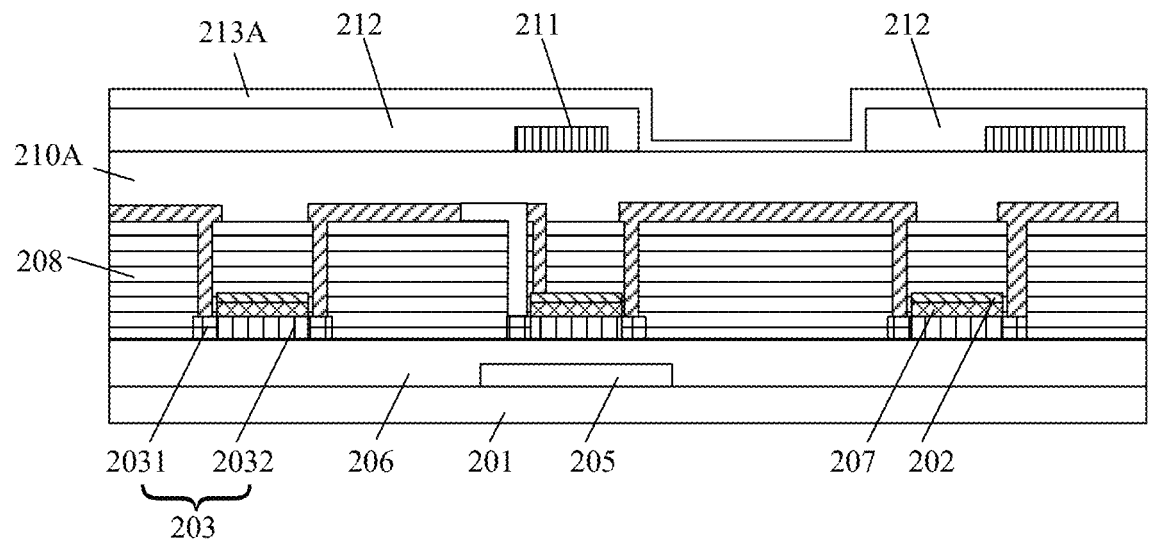
FIG. 2D is still yet another schematic view showing the manufacture of the display substrate according to one embodiment of the present disclosure.

As shown in FIG. 2D, a transparent conductive material such as indium tin oxide (ITO) is deposited to form a first transparent conductive layer 213A.

Step 106: forming the through hole through a patterning process.

Figure 2E:
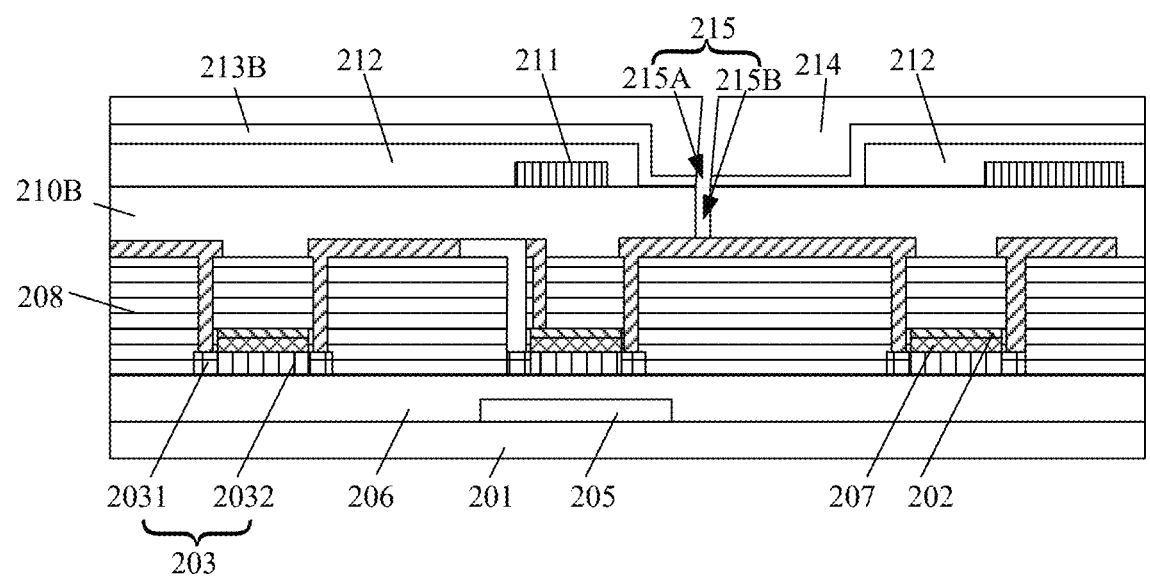
FIG. 2E is still yet another schematic view showing the manufacture of the display substrate according to one embodiment of the present disclosure.

As shown in FIGS. 2D and 2E, after the first transparent conductive layer 213A has been deposited, a through hole 215 is formed in a region where the pattern of the planarization layer 212 does not cover the inorganic insulation layer 210A, i.e., the exposed portion of the inorganic insulation layer 210A after the organic material layer is patterned to form the pattern of the planarization layer.

The through hole 215 extends through the inorganic insulation layer 210A and the first transparent conductive layer 213A in the direction perpendicular to the base substrate 210. Usually, the patterning process includes exposing, developing, etching, etc. The photoresist used during the exposure includes an organic material.

During the formation of the through hole 215 through a patterning process, a photoresist 214 needs to be applied. Generally speaking, the photoresist 214 includes an organic material, and the planarization layer 212 is also made of an organic material. There is excellent adhesion between the organic materials, so it is difficult to remove the photoresist 214, i.e., there is the residual photoresist 214.

However, in the embodiments of the present disclosure, the first transparent conductive layer 213A made of an inorganic material, e.g., ITO, is further arranged on the planarization layer 212, and there is relatively low adhesion between the organic material and the first transparent conductive layer 213A. As a result, it is able to facilitate the removal of the photoresist 214, and prevent the risk of the residual photoresist 214, thereby to improve the performance of the display device.

According to the embodiments of the present disclosure, through the first transparent conductive layer 213A, it is able to prevent the organic material of the planarization layer 212 from being in direct contact with the photoresist 214 for forming the through hole 215 in the inorganic insulation layer 210A, reduce the difficulty in the removal of the photoresist 214 subsequently, and reduce the quantity of residual photoresist 214, thereby to improve the structure reliability.

In a possible embodiment of the present disclosure, the forming the through hole through a patterning process includes: patterning the first transparent conductive layer to form a first conductive pattern including a first through sub-hole 215A; and patterning the inorganic insulation layer to form a protection layer pattern including a second through sub-hole 215B.

With reference to FIGS. 2D and 2E, in the embodiments of the present disclosure, the first through sub-hole 215A is formed in the first transparent conductive layer 213A, and then the second through sub-hole 215B is formed in the inorganic insulation layer 210A at a position corresponding to the first through sub-hole 215A.

As shown in FIG. 2E, orthogonal projections of the first through sub-hole 215A and the second through sub-hole 215B onto the base substrate overlap each other, i.e., the first through sub-hole 215A and the second through sub-hole 215B form a through hole 215 extending from the first transparent conductive layer to the inorganic insulation layer.

In some embodiments of the present disclosure, the patterning the first transparent conductive layer to form the first conductive pattern including a first through sub-hole 215A includes: forming a photoresist on the first transparent conductive layer, and exposing and developing the photoresist to form a first photoresist unreserved region corresponding to a region where the first through sub-hole 215A is to be formed and a first photoresist reserved region; and wet etching the first transparent conductive layer at the first photoresist unreserved region. The patterning the inorganic insulation layer to form the protection layer pattern including the second through sub-hole 215B includes: dry etching the inorganic insulation layer at the first photoresist unreserved region; and removing the photoresist at the first photoresist reserved region.

As shown in FIGS. 2D and 2E, specifically, in the embodiments of the present disclosure, the photoresist 214, e.g., a positive photoresist or a negative photoresist, is applied onto the first transparent conductive layer 213A.

Next, the photoresist 214 is exposed and developed, (an exposed and developed region needs to be determined according to properties of the photoresist), so as to form the first photoresist unreserved region and the first photoresist reserved region.

The first photoresist unreserved region corresponds to the first through sub-hole 215A to be formed. The first transparent conductive layer 213A in the first photoresist unreserved region is etched, e.g., wet-etched, so as to remove the first transparent conductive layer 213A in the region, thereby to expose the inorganic insulation layer 210A. In this way, the first transparent conductive layer 213A located at the first photoresist reserved region is reserved to form the first conductive pattern 213B including the first through sub-hole 215A.

Next, the inorganic insulation layer 210A in the first photoresist unreserved region is etched, e.g., dry-etched, so as to pattern the inorganic insulation layer 210A and reserve the inorganic insulation layer 210A in the first photoresist reserved region. In this way, the inorganic insulation layer 210A forms a pattern of the protection layer 210B including the second through sub-hole.

Figure 2F:
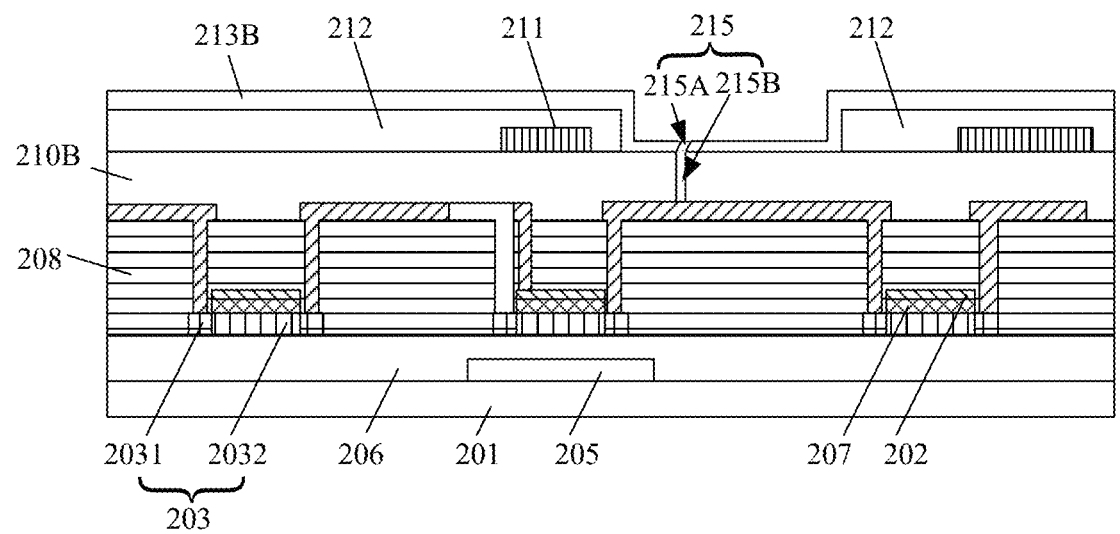
FIG. 2F is still yet another schematic view showing the manufacture of the display substrate according to one embodiment of the present disclosure.

As shown in FIG. 2F, after patterning the first transparent conductive layer 213A and the inorganic insulation layer 210A, the photoresist 214 at the first photoresist reserved region is removed. In this way, in the embodiments of the present disclosure, it is able to obtain the first conductive pattern 213B and the protection layer 210B with the through hole 215 through patterning the first transparent conductive layer 213A and the inorganic insulation layer 210A merely through one mask.

In the embodiments of the present disclosure, an angle between a side wall of the first through sub-hole 215A and a direction parallel to the base substrate 201 is less than an angle between a side wall of the second through sub-hole 215B and the direction parallel to the base substrate 201, i.e., a slope of the first through sub-hole 215A is less than a slope of the second through sub-hole 215B.

In some embodiments of the present disclosure, the slope of the first through sub-hole 215A and the slope of the second through sub-hole 215B are controlled through an etching method. Specifically, the first transparent conductive layer 213A is etched through wet etching, and the inorganic insulation layer 210A is etched through dry etching, so that the slope of the first through sub-hole 215A is smaller than the slope of the second through sub-hole 215B.

When the slope of the first through sub-hole 215A is smaller than the slope of the second through sub-hole 215B, it is able to reduce an area of a region for forming the through hole, prevent a display effect from being adversely affected, and facilitate the etching of the inorganic insulation layer 210A.

In some embodiments of the present disclosure, subsequent to forming the through hole through a patterning process, the method further includes: forming a second transparent conductive layer on the first conductive pattern; and patterning the first conductive pattern and the second transparent conductive layer to form a first electrode including a first electrode sub-layer and a second electrode sub-layer.

Figure 2G:
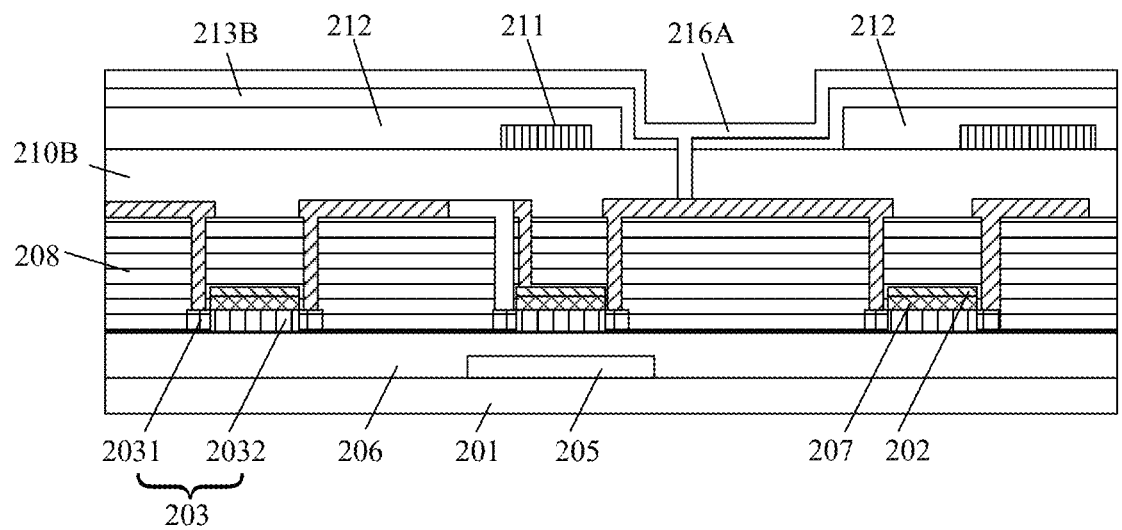
FIG. 2G is still yet another schematic view showing the manufacture of the display substrate according to one embodiment of the present disclosure.

As shown in FIG. 2G, after the formation of the first conductive pattern 213B, the second transparent conductive layer 216A is formed on the first conductive pattern 213B. The second transparent conductive layer 216A is also made of ITO, and it is electrically coupled to the driving circuitry layer through the through hole. Specifically, the second transparent conductive layer 216A is electrically coupled to the source electrode or the drain electrode of the thin film transistor in the driving circuitry layer.

In some embodiments of the present disclosure, the patterning the first conductive pattern and the second transparent conductive layer includes: forming a photoresist on the second transparent conductive layer, and exposing and developing the photoresist to form a second photoresist unreserved region and a second photoresist reserved region to the through hole and the first electrode to be formed; etching the first conductive pattern and the second transparent conductive layer in the second photoresist unreserved region, so as to form the first electrode sub-layer through the first conductive pattern in the second photoresist reserved region, and form the second electrode sub-layer through the second transparent conductive layer in the second photoresist reserved region; and removing the photoresist in the second photoresist reserved region.

Figure 2H:
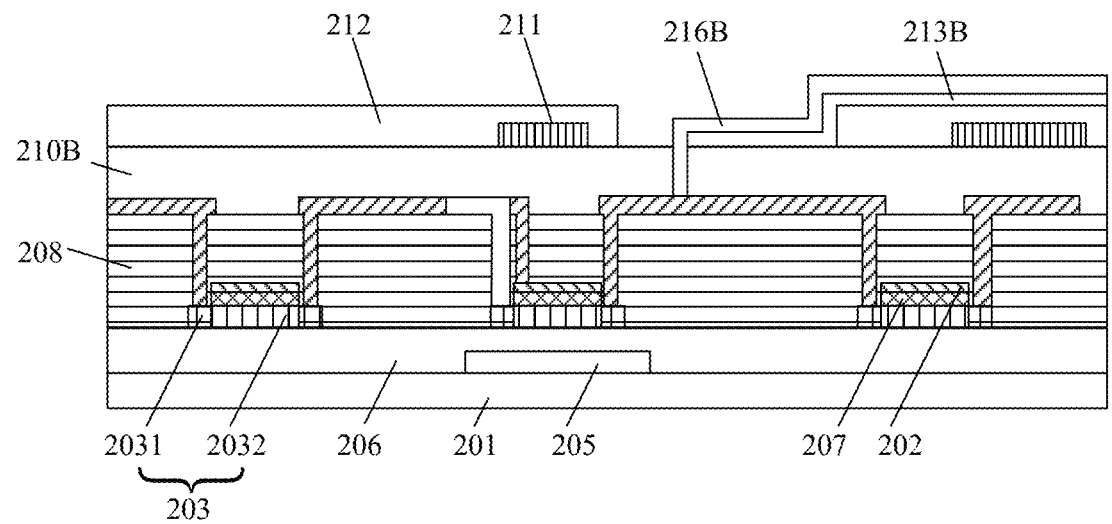
FIG. 2H is still yet another schematic view showing the manufacture of the display substrate according to one embodiment of the present disclosure.

As shown in FIG. 2H, in the embodiments of the present disclosure, the first conductive pattern 213B is patterned to form the first electrode sub-layer 213C, the second transparent conductive layer 216A is patterned to form the second electrode sub-layer 216B is formed, and the first electrode sub-layer 213C and the second electrode sub-layer 216A together form the first electrode of the display substrate. In the embodiments of the present disclosure, the first electrode is an anode of the display substrate.

In this way, in the embodiments of the present disclosure, it is able to pattern the first conductive pattern 213B and the second transparent conductive layer 216A merely through one mask, i.e., without any additional mask, thereby to reduce the manufacture cost.

In some embodiments of the present disclosure, a thickness of the first electrode sub-layer 213C is less than a thickness of the second electrode sub-layer 216A in the direction perpendicular to the base substrate 201, a sum of the thicknesses of the first electrode sub-layer 213C and the second electrode sub-layer 216A is 50 nm to 200 nm, and film-forming conditions of the first electrode sub-layer 213C and the second electrode sub-layer 216A are the same.

In the embodiments of the present disclosure, the first electrode sub-layer 213C is mainly used to prevent the photoresist 214 from being in contact with the pattern of the planarization layer 212 when patterning the inorganic insulation layer 210A, so the thickness of the first electrode sub-layer is relatively small. The second electrode sub-layer 216B is mainly used to transmit an electric signal, so the thicknesses of the second electrode sub-layer 216B is relatively large. Correspondingly, the transparency of the first electrode sub-layer 213C is greater than the transparency of the second electrode sub-layer in the case of a same material.

It should be appreciated that, in the embodiments of the present disclosure, the transparency of the first electrode needs to be large enough to ensure the display effect. During the implementation, the transparency of the first electrode is determined according to the practical need, and then the thicknesses of the first electrode sub-layer 213C and the second electrode sub-layer 216B are determined.

In the embodiments of the present disclosure, the thickness of the first electrode is 50 nm to 200 nm, and correspondingly, the sum of the thicknesses of the first electrode sub-layer 213C and the second electrode sub-layer 216A is 50 nm to 200 nm, so as to make a balance between the conductivity and the transparency of the first electrode. In other words, the first electrode has high transparency while ensuring its conductivity.

In the embodiments of the present disclosure, the film-forming conditions of the first electrode sub-layer 213C and the second electrode sub-layer 216A are the same, i.e., parameters for forming the first electrode sub-layer 213C and the second electrode sub-layer 216A, e.g., temperature, material and process, are the same. In this way, the performance and structure of the first electrode sub-layer 213C are similar to those of the second electrode sub-layer 216A to a great extent, and the first electrode sub-layer 213C is bound to the second electrode sub-layer 216A in a better manner, so it is able to reduce a resistance between the first electrode sub-layer 213C and the second electrode sub-layer 216A, thereby to improve the electrical performance of the first electrode.

In some embodiments of the present disclosure, an orthogonal projection of the first electrode sub-layer 213C onto the base substrate 201 is located within an orthogonal projection of the second electrode sub-layer 216B onto the base substrate 201.

In the embodiments of the present disclosure, the first transparent conductive layer 213A is patterned to form the first conductive pattern 213B including the first through sub-hole 215A. Next, the first conductive pattern 213B and the second transparent conductive layer 216A are patterned simultaneously to form the first electrode. The first conductive pattern 213B and the second transparent conductive layer 216A are patterned through a same patterning process to form the first electrode sub-layer 213C and the second electrode sub-layer 216B respectively, so an area of the first electrode sub-layer 213C is not greater than an area of the second electrode sub-layer 216B.

Figure 2I:
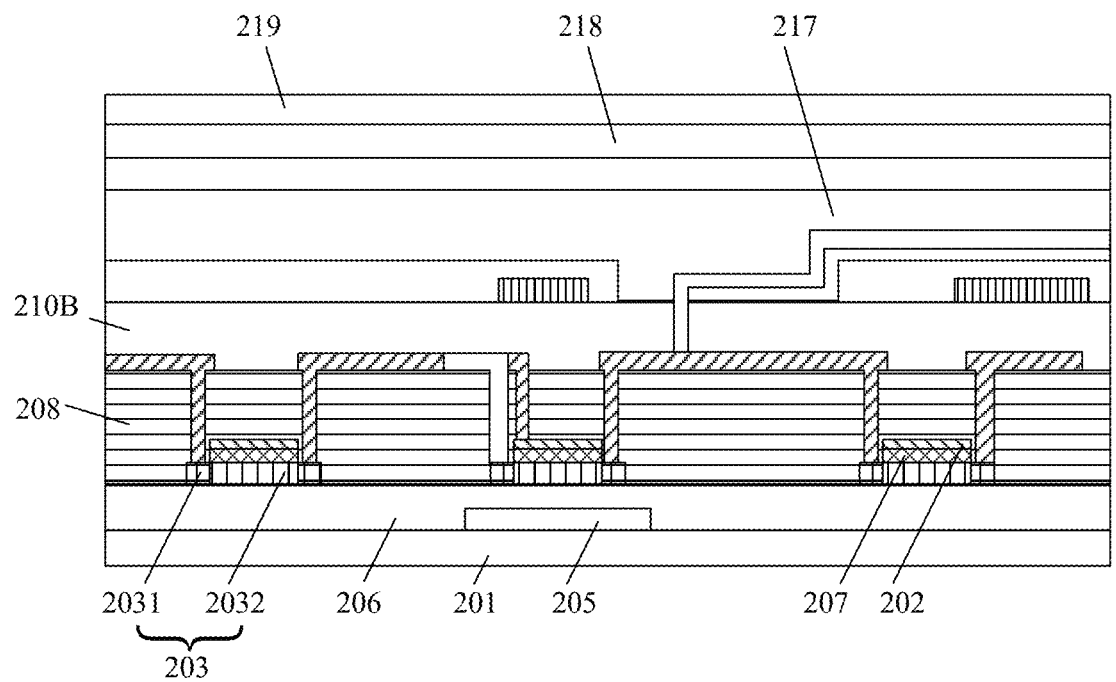
FIG. 2I is still yet another schematic view showing the manufacture of the display substrate according to one embodiment of the present disclosure.

As shown in FIG. 2I, after the formation of the first electrode, such structures as a pixel definition layer, a light-emitting layer 217 and a second electrode 218 are formed. The first electrode, the light-emitting layer 217 and the second electrode 218 form a light-emitting unit of the display substrate.

After the formation of the light-emitting unit, other structures, such as an encapsulation structure 219, is formed, which will not be particularly defined herein.

The present disclosure further provides in some embodiments a display substrate manufactured through the above-mentioned method. The present disclosure further provides in some embodiments a display device including the above-mentioned display substrate.

The implementation of the display substrate and the display device may refer to that of the above-mentioned method with a same technical effect, and thus will not be particularly defined herein.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a display substrate, comprising:
   providing a base substrate;
   forming a driving circuitry layer on the base substrate;
   forming an inorganic insulation layer on the driving circuitry layer; forming a pattern of a planarization layer on the inorganic insulation layer, a material of the planarization layer comprising an organic material, and the pattern of the planarization layer covering a partial region of the inorganic insulation layer;
   forming a first transparent conductive layer on the planarization layer; and
   forming a through hole through a patterning process in a region where the inorganic insulation layer is not covered by the pattern of the planarization layer, the through hole penetrating through the inorganic insulation layer and the first transparent conductive layer in a direction perpendicular to the base substrate, and a photoresist used during the exposure of the patterning process comprising an organic material;
   wherein the forming the through hole through a patterning process comprises: patterning the first transparent conductive layer to form a first conductive pattern comprising a first through sub-hole; and patterning the inorganic insulation layer to form a protection layer pattern comprising a second through sub-hole, wherein orthogonal projections of the first through sub-hole and the second through sub-hole onto the base substrate overlap each other, and the first through sub-hole and the second through sub-hole form the through hole;
   wherein an angle between a side wall of the first through sub-hole and a direction parallel to the base substrate is less than an angle between a side wall of the second through sub-hole and the direction parallel to the base substrate;
   wherein subsequent to forming the through hole through a patterning process, the method further comprises: forming a second transparent conductive layer on the first conductive pattern, the second transparent conductive layer being electrically coupled to the driving circuitry layer through the through hole; and patterning the first conductive pattern and the second transparent conductive layer to form a first electrode comprising a first electrode sub-layer and a second electrode sub-layer, the first conductive pattern forming the first electrode sub-layer and the second transparent conductive layer forming the second electrode sub-layer.

2. The method according to claim 1, wherein the patterning the first transparent conductive layer to form the first conductive pattern comprising a first through sub-hole comprises: forming a photoresist on the first transparent conductive layer, and exposing and developing the photoresist to form a first photoresist unreserved region corresponding to a region where the first through sub-hole is to be formed and a first photoresist reserved region; and wet etching the first transparent conductive layer at the first photoresist unreserved region so as to expose a part of the inorganic insulation layer corresponding to the first photoresist unreserved region, the first transparent conductive layer located in the first photoresist reserved region forming the first conductive pattern, wherein the patterning the inorganic insulation layer to form the protection layer pattern comprising the second through sub-hole comprises: dry etching the inorganic insulation layer at the first photoresist unreserved region to form a pattern of a protection layer through the inorganic insulation layer in the first photoresist reserved region; and removing the photoresist at the first photoresist reserved region.

3. The method according to claim 1, wherein the patterning the first conductive pattern and the second transparent conductive layer comprises: forming a photoresist on the second transparent conductive layer, and exposing and developing the photoresist to form a second photoresist unreserved region and a second photoresist reserved region, wherein the second photoresist reserved region corresponds to a region where the through hole is located and the first electrode is to be formed; etching the first conductive pattern and the second transparent conductive layer in the second photoresist unreserved region, so as to form the first electrode sub-layer through the first conductive pattern in the second photoresist reserved region, and form the second electrode sub-layer through the second transparent conductive layer in the second photoresist reserved region; and removing the photoresist in the second photoresist reserved region.

4. The method according to claim 1, wherein an orthogonal projection of the first electrode sub-layer onto the base substrate is located within an orthogonal projection of the second electrode sub-layer onto the base substrate.

5. The method according to claim 1, wherein a thickness of the first electrode sub-layer is less than a thickness of the second electrode sub-layer in a direction perpendicular to the base substrate, a sum of the thicknesses of the first electrode sub-layer and the second electrode sub-layer is 50 nm to 200 nm, and film-forming conditions of the first electrode sub-layer and the second electrode sub-layer are the same.

* * * * *